(12) United States Patent
Shin et al.

(10) Patent No.: US 11,183,402 B2
(45) Date of Patent: Nov. 23, 2021

(54) LASER ANNEALING APPARATUS FOR SEMICONDUCTORS HAVING MULTIPLE LASER ENERGY MEASURING MEANS

(71) Applicant: SAMSUNG ELECTRONICS CO., LTD., Suwon-si (KR)

(72) Inventors: Joong-han Shin, Yongin-si (KR); Supakit Charnvanichborikarn, Seongnam-si (KR); Bong-jin Kuh, Suwon-si (KR); Ki-chul Kim, Seongnam-si (KR); Jae-hee Lee, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 554 days.

(21) Appl. No.: 15/795,746

(22) Filed: Oct. 27, 2017

(65) Prior Publication Data

US 2018/0308725 A1   Oct. 25, 2018

(30) Foreign Application Priority Data

Apr. 21, 2017   (KR) .................. 10-2017-0051658

(51) Int. Cl.
*C30B 28/08*   (2006.01)
*C30B 13/24*   (2006.01)
(Continued)

(52) U.S. Cl.
CPC ........ *H01L 21/67115* (2013.01); *C30B 13/24* (2013.01); *C30B 28/08* (2013.01);
(Continued)

(58) Field of Classification Search
CPC . H01L 21/324; H01L 21/67115; H01L 21/30; H01L 21/67288; C30B 28/08
(Continued)

(56) References Cited

U.S. PATENT DOCUMENTS

| | | |
|---|---|---|
| 4,956,538 A | 9/1990 | Moslehi |
| 5,782,974 A | 7/1998 | Sorensen et al. |

(Continued)

FOREIGN PATENT DOCUMENTS

| | | | |
|---|---|---|---|
| JP | 2003-109910 A | | 4/2003 |
| JP | 2003109910 A | * | 4/2003 |

(Continued)

OTHER PUBLICATIONS

Xu, et al., Nanosecond-time-resolution thermal emission measurement during pulsed excimer-laser interaction with materials, Appl. Phys. A 62, 51-59 (1996).

(Continued)

*Primary Examiner* — Christopher M Koehler
*Assistant Examiner* — Spencer H. Kirkwood
(74) *Attorney, Agent, or Firm* — Lee IP Law, P.C.

(57) ABSTRACT

A laser annealing apparatus includes a laser oscillating structure, an oscillator, a beam expanding telescope, a first power meter, and a second power meter. The laser oscillating structure emits a first laser beam of a first wavelength and first beam cross-section to a substrate in a chamber including an optical window. The oscillator emits a second laser beam, of a second wavelength different from the first wavelength, to the substrate. The beam expanding telescope is on an optical path for the second laser beam and expands the second laser beam to a second beam cross-section. The first and second power meters measure energy of the second laser beam and a third laser beam, generated as the second laser beam is reflected by the substrate. The first beam cross-section and the second beam cross-section may be equal.

11 Claims, 10 Drawing Sheets

(51) Int. Cl.
    *G01N 21/00*     (2006.01)
    *H01L 21/67*     (2006.01)
    *G01N 21/55*     (2014.01)

(52) U.S. Cl.
    CPC ............ *G01N 21/00* (2013.01); *G01N 21/55* (2013.01); *H01L 21/67253* (2013.01)

(58) Field of Classification Search
    USPC .................................................. 219/121.61
    See application file for complete search history.

(56) References Cited

U.S. PATENT DOCUMENTS

| | | | |
|---|---|---|---|
| 6,188,041 B1 * | 2/2001 | Kim | B23K 26/034 |
| | | | 219/121.6 |
| 8,865,603 B2 | 10/2014 | Hawryluk et al. | |
| 2006/0260545 A1 * | 11/2006 | Ramaswamy | C23C 16/26 |
| | | | 118/719 |
| 2010/0111511 A1 * | 5/2010 | Merry | C23C 16/481 |
| | | | 392/411 |
| 2011/0132549 A1 * | 6/2011 | Sercel | B32B 38/0008 |
| | | | 156/712 |
| 2011/0237080 A1 * | 9/2011 | Liu | B08B 7/0042 |
| | | | 438/694 |
| 2016/0096236 A1 | 4/2016 | Cho et al. | |

FOREIGN PATENT DOCUMENTS

| | | | |
|---|---|---|---|
| JP | 2007-271399 | A | 10/2007 |
| JP | 2007271399 | A * | 10/2007 |
| JP | 5105903 | B2 | 12/2012 |
| JP | 2016-219584 | A | 12/2016 |
| KR | 10-0709036 | B1 | 4/2007 |

OTHER PUBLICATIONS

Chen, et al., Noncontact nanosecond-time-resolution temperature measurement in excimer laser heating of Ni—P disk substrates, Appl. Phys. Lett. 71 (22), (Dec. 1, 1997).

Moon, et al., Transient temperature measurement of amorphous silicon thin films during excimer laser annealing, Proceedings of SPIE, vol. 3628, Jan. 1999, 302-309.

* cited by examiner

LASER ANNEALING APPARATUS FOR SEMICONDUCTORS HAVING MULTIPLE LASER ENERGY MEASURING MEANS

CROSS-REFERENCE TO RELATED APPLICATION

Korean Patent Application No. 10-2017-0051658, filed on Apr. 21, 2017, and entitled: "Laser Annealing Apparatus," is incorporated by reference herein in its entirety.

BACKGROUND

1. Field

One or more embodiments described herein relate to a laser annealing apparatus.

2. Description of the Related Art

Laser annealing is a technique for using a laser beam to locally melt and re-crystallize an upper portion of a semiconductor substrate. Through laser annealing, for example, an amorphous semiconductor substrate may be crystallized or defects of a semiconductor substrate may be cured. A high output pulse laser is used in the liquid phase epitaxial growth, and a continuous wave laser is used in the solid phase.

In one example application laser annealing is used to locally and selectively provide precise heat treatment within a short period of time using the energy-energy-intensive property of a laser beam.

Laser annealing is widely used for implanting impurities into a semiconductor or for forming a metal layer or an oxide layer. Also, a silicon-on-insulator (SOI) technique may be used to form silicon monocrystals by selectively melting a silicon oxide insulating film and re-crystallizing the same has been developed. This technique may be used for 3-dimensionalization and large integration of a semiconductor device.

SUMMARY

In accordance with one or more embodiments, a laser annealing apparatus includes a laser oscillating structure to emit a first laser beam having a first wavelength and a first beam cross-section to a semiconductor substrate inside a chamber that includes an optical window; a laser oscillator to emit a second laser beam to the semiconductor substrate, the second laser beam having a second wavelength different from the first wavelength; a beam expanding telescope on an optical path for the second laser beam, the beam expanding telescope to expand a cross-section of the second laser beam to a second beam cross-section; a first power meter to measure energy of the second laser beam; and a second power meter to measure energy of a third laser beam, wherein the third laser beam is generated as the second laser beam is reflected by the semiconductor substrate and wherein an area of the first beam cross-section of the first laser beam that reached the semiconductor substrate is identical to an area of the second beam cross-section.

In accordance with one or more other embodiments, a laser annealing system includes a chamber to move in one direction, the chamber to accommodate therein a semiconductor substrate and having an optical window; a laser oscillating structure to emit, through the optical window, a first laser beam having a first wavelength to a first region on the semiconductor substrate; a laser oscillator to emit, through the optical window, a second laser beam to a second region on the semiconductor substrate, the second laser beam having a second wavelength different from the first wavelength; a first power meter to measure energy of the second laser beam; and a second power meter to measure energy of third laser beam, wherein the third laser beam is a light beam generated as the second laser beam is reflected by the semiconductor substrate and wherein the second region includes the first region.

In accordance with one or more other embodiments, an apparatus includes an optical arrangement to direct one or more laser beams on a semiconductor substrate during an annealing operation; and a detector to detect information indicative of melting or reflectivity of the semiconductor substrate during the annealing operation.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
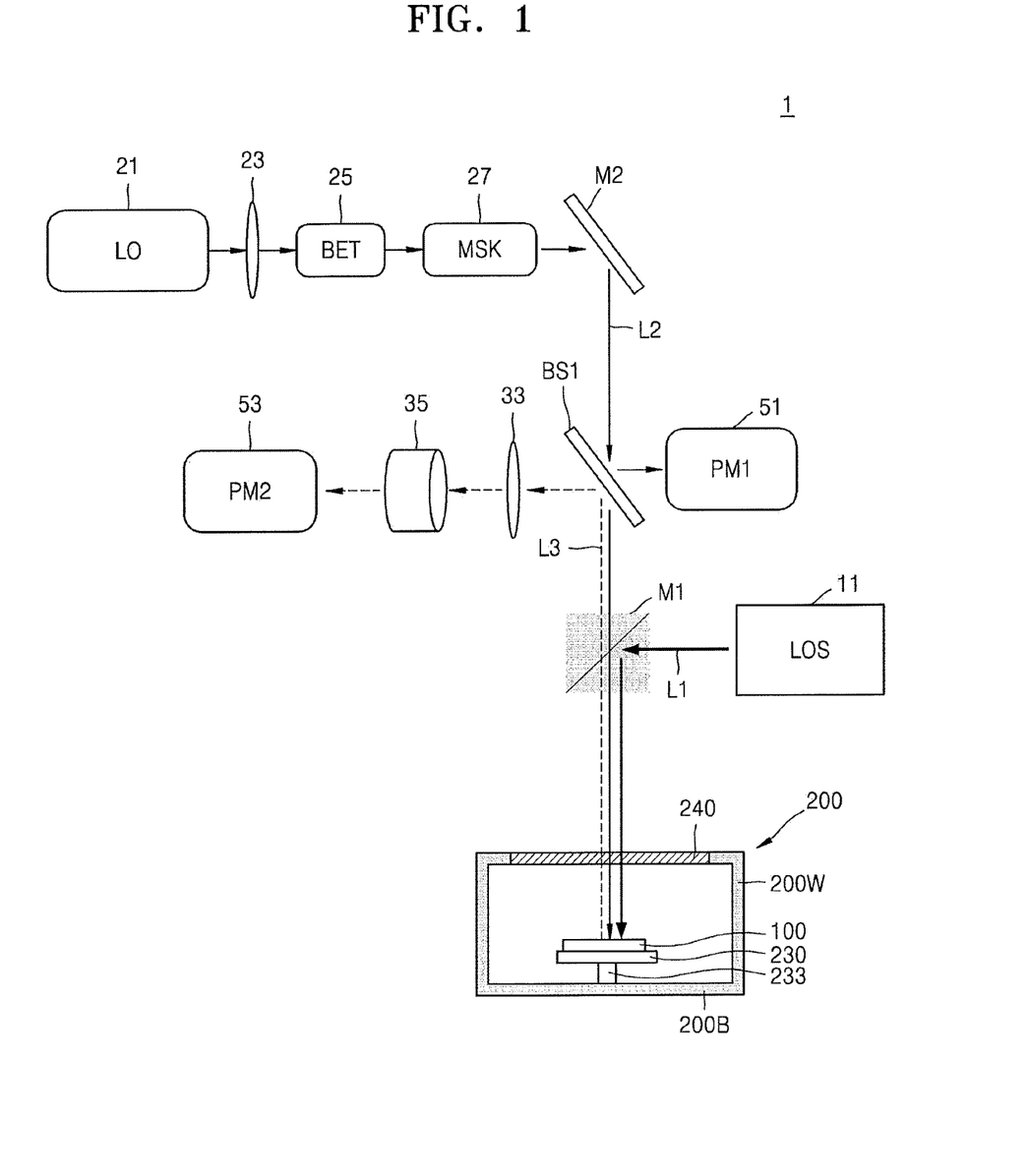
FIG. 1 illustrates an embodiment of a laser annealing apparatus.

FIG. 1 illustrates an embodiment of a laser annealing apparatus 1 which may include a laser oscillation structure (LOS) 11, a laser oscillator (LO) 21, first and second band blocking filters 23 and 33, a beam expansion telescope (BET) 25, a beam mask (MSK) 27, a first focusing lens 35, first and second power meters (PM1 and PM2) 51 and 53, a first and second reflection mirrors M1 and M2, and a chamber 200. The LOS, LO, filters, BET, MASK, and/or lens may be considered to be an optical arrangement, and the meters PM1 and PM2 may be considered to be a detector, in at least one embodiment.

According to some embodiments, the chamber 200 may have an interior space in which a laser annealing process is performed. The chamber 200 may include a bottom portion 200B and a wall portion 200W extending in a direction substantially perpendicular to the bottom from edges of the bottom portion 200B. The interior space of the chamber 200 may be surrounded by the bottom portion 200B and the wall portion 200W.

A chuck 230 may be placed on the bottom portion 200B of the chamber 200. A semiconductor substrate 100 to be annealed may be mounted on the chuck 230. The chuck 230 has a top surface on which the semiconductor substrate 100 is loaded. The chuck 230 may be an electrostatic chuck that fixes the loaded semiconductor substrate 100 by electrostatic force. In one embodiment, the chuck 230 may be a vacuum chuck that fixes the loaded semiconductor substrate 100 by vacuum pressure. The chuck 230 may be placed on a chuck supporter 233 connected to the bottom portion 200B of the chamber 200. The chuck supporter 233 may have a predetermined shape. For example, the chuck supporter 233 may have a pillar-like shape, e.g., a cylindrical pillar-like shape. In another embodiment, the chuck supporter 233 may have a different shape.

The chamber 200 may further include an optical window 240 that closes at least a portion of the top of the interior space. The optical window 240 may include a material capable of transmitting light therethrough. The optical window 240 may transmit light of multiple wavelengths, e.g., first and second wavelengths. The optical window 240 may include a material such as quartz or another material.

A first laser beam L1 for annealing the semiconductor substrate 100 is irradiated onto the semiconductor substrate 100 through the optical window 240. The upper portion of the semiconductor substrate 100 is melted as the first laser beam L1 is irradiated onto the surface of the semiconductor substrate 100 in an amorphous state. When this occurs, a part of the material of the semiconductor substrate 100 may be vaporized. During this process, the optical window 240 may be contaminated by substances in a gas generated during vaporization. This contamination may involve, for example, substances in the gas attaching to the optical window 240.

When the optical window 240 is contaminated, transmittance of laser beams through the optical window 240 may deteriorate. As a result, the laser beam(s) may not be sufficiently irradiated onto the semiconductor substrate 100. When this occurs, the semiconductor substrate 100 may remain in the amorphous state or a diameter of crystal grains may not grow sufficiently. Thus, the quality of the semiconductor substrate 100 may be deteriorated. Properties and states of the optical window 240 (e.g., transparency, uniformity, and contamination of the optical window 240) may therefore significantly affect the efficiency of laser annealing.

According to some embodiments, the semiconductor substrate 100 may include a semiconductor, e.g., Si, Ge, or a compound semiconductor such as SiGe, SiC, GaAs, InAs, or InP. According to some embodiments, the semiconductor substrate 100 may have a silicon-on-insulator (SOI) structure. The semiconductor substrate 100 may include a conductive region, e.g., a well doped with an impurity or a structure doped with an impurity.

The LOS 11 may emit a laser beam, e.g., an excimer laser beam. The LOS 11 may emit the first laser beam L1 to the semiconductor substrate 100. The first laser beam L1 may be irradiated onto the semiconductor substrate 100 and anneal the semiconductor substrate 100. The first laser beam and L1 and a second laser beam L2 may be irradiated onto the loaded semiconductor substrate 100 via the optical window 240. As the first laser beam L1 is irradiated, a portion of the top surface of the semiconductor substrate 100 may be melted and re-crystallized. When the semiconductor substrate 100 includes amorphous silicon, the upper portion of the semiconductor substrate 100 may be crystallized to become polysilicon through laser annealing.

The first laser beam L1 may have a first beam cross-section and a first wavelength. The first laser beam L1 may travel along a first optical path. According to some embodiments, the first beam cross-section may be tetragonal, for example. According to some other embodiments, the first beam cross-section may be rectangular. According to some other embodiments, the first beam cross-section may have a square shape. In one embodiment, the first beam cross-section may be a different shape, including but not limited to triangular, pentagonal or higher polygonal, elliptical, or circular. When the first beam cross-section is tetragonal, the first beam cross-section may perform laser annealing without an overlapping area. The efficiency of laser annealing may therefore be improved.

The first beam cross-section refers to a cross-section of the first laser beam L1 substantially perpendicular to the travelling direction of the first laser beam L1. The first beam cross-section may correspond to an area on a plane perpendicular to the first optical path, the area reached by the first laser beam L1. The second beam cross-section may be substantially identical to the first beam cross-section. The LOS 11 includes a laser light source emitting the first laser beam L1, a beam expansion telescope that makes the first beam cross-section into a certain cross-sectional area, and a MSK that makes the first beam cross-section into a certain cross-sectional shape.

Referring to FIG. 1, the first reflection mirror M1 may be arranged on the first optical path. The first reflection mirror M1 may reflect the first laser beam L1. The first reflection mirror M1 may exhibit a high reflectivity for the first wavelength. The first reflection mirror M1 may transmit the second laser beam L2 therethrough. For example, the first reflection mirror M1 may exhibit a predetermined, relatively high transmittance with respect to light of the second wavelength. The first reflection mirror M1 may be, for example, a dichromatic mirror.

According to some embodiments, the first reflection mirror M1 may transmit portions of the first and second laser beams L1 and L2 and may reflect different portions of the first and second laser beams L1 and L2. Therefore, the first reflection mirror M1 may correspond to a beam splitter that splits the first and second laser beams L1 and L2.

FIG. 1 illustrates use of the first reflection mirror M1 is provided. In other embodiments of an optical system, the first reflection mirror M1 may be omitted or two or more first reflection mirrors M1 may be provided.

According to some embodiments, the chamber 200 moves two-dimensionally on a plane parallel to the top surface of the mounted semiconductor substrate 100. Thus, the first laser beam L1 may irradiated on the entire top surface of the mounted semiconductor substrate 100. In one embodiment, the chamber 200 may be fixed, and the laser annealing apparatus 1 only may move two-dimensionally on a plane parallel to the top surface of the mounted semiconductor substrate 100.

The LO 21 may emit the second laser beam L2 having a second wavelength different from the first wavelength to the semiconductor substrate 100. The second wavelength may be different from (e.g., longer than) the first wavelength.

The first band blocking filter 23 may be on a second optical path, which is a path for the second laser beam L2. The first band blocking filter 23 may block light of the first wavelength light and may transmit light of the second wavelength therethrough.

The LO 21 may emit not only light of the first wavelength, but also light of the second wavelength. The first band blocking filter 23 may improve the reliability of measuring the contamination of the optical window 240 by blocking light of the first wavelength generated by the LO 21.

The BET 25 may be on the second optical path and may expand the second laser beam L2. The BET 25 may expand the second beam cross-section by a predetermined ratio. The second laser beam L2 expanded by the BET 25 may reach the MSK 27.

In FIG. 1, the second laser beam L2 passes through the BET 25 after passing through the first band blocking filter

23. In another embodiment, the second laser beam L2 may pass through the BET 25 and then pass through the first band blocking filter 23.

Figure 2A:
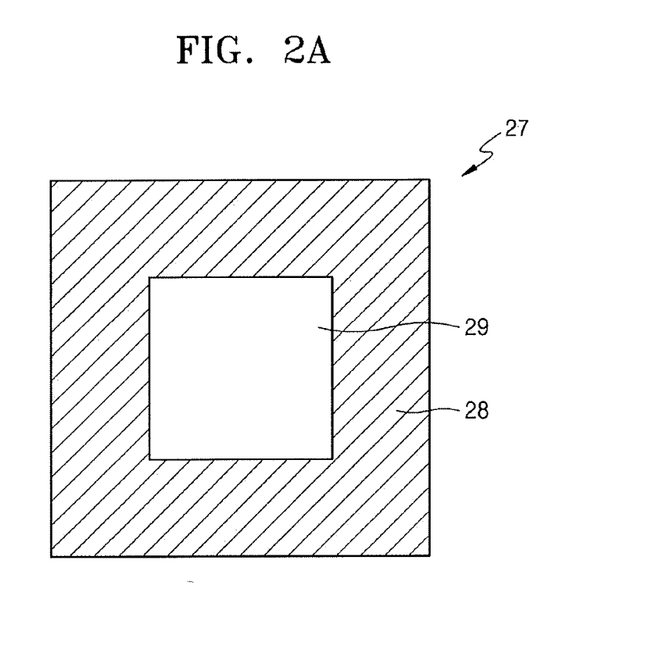
FIGS. 2A-2C illustrate layout embodiments of a beam mask.
Figure 2B:
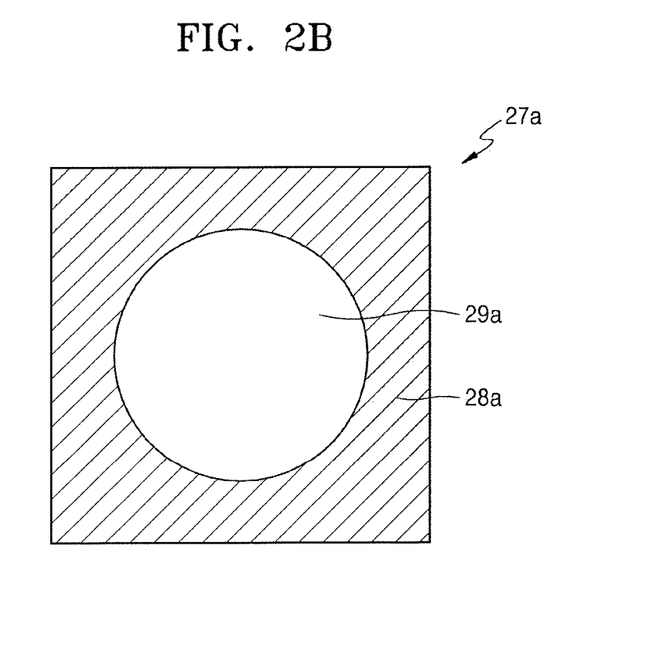
Figure 2C:
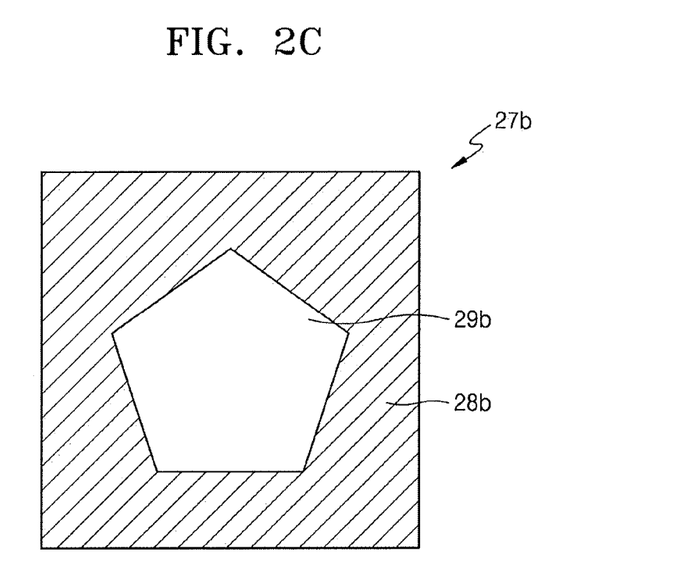

FIGS. 2A to 2C illustrate embodiments of layout diagrams showing the MSK 27 that may be included in the laser annealing apparatus 1. Referring to FIGS. 2A to 2C, the MSK 27 may include a light screening region 28 and a light transmitting region 29 defined by the light screening region 28. According to some embodiments, the light screening region 28 may surround the light transmitting region 29. The light screening region 28 is a region that blocks light, and the light transmitting region 29 is a region that transmits light therethrough. The second laser beam L2 able to pass through the light transmitting region 29, but is unable to pass through the light screening region 28. The shape of the cross-section of the second laser beam passing through the MSK 27 and the shape of the light transmitting region 29 may be substantially identical to each other.

The light transmitting regions 29, 29a, and 29b of the MSKs 27, 27a, and 27b may include various shapes. For example, referring to FIG. 2A, the light transmitting region 29 of the MSK 27 may be tetragonal. According to some embodiments, the light transmitting region 29 of the MSK 27 may be rectangular. According to some embodiments, the light transmitting region 29 of the MSK 27 may have a square shape. Referring to FIG. 2B, according to some embodiments, the light transmitting region 29a of the MSK 27a may be circular or elliptical. Referring to FIG. 2C, according to some embodiments, the light transmitting region 29b of the MSK 27b may be polygonal or another predetermined shape.

The light transmitting region 29 the MSK 27 may correspond to a first beam cross-section. According to some embodiments, the light transmitting region 29 may be similar to the shape of the first beam cross-section. According to some embodiments, a profile of the light transmitting region 29 may be substantially identical to a profile of the first beam cross-section. According to some embodiments, the width of the light transmitting region 29 may be substantially identical to the width of the first beam cross-section. According to some embodiments, the light transmitting region 29 may be substantially identical to the shape of the first beam cross-section, for example, when viewed from above.

Figure 3A:
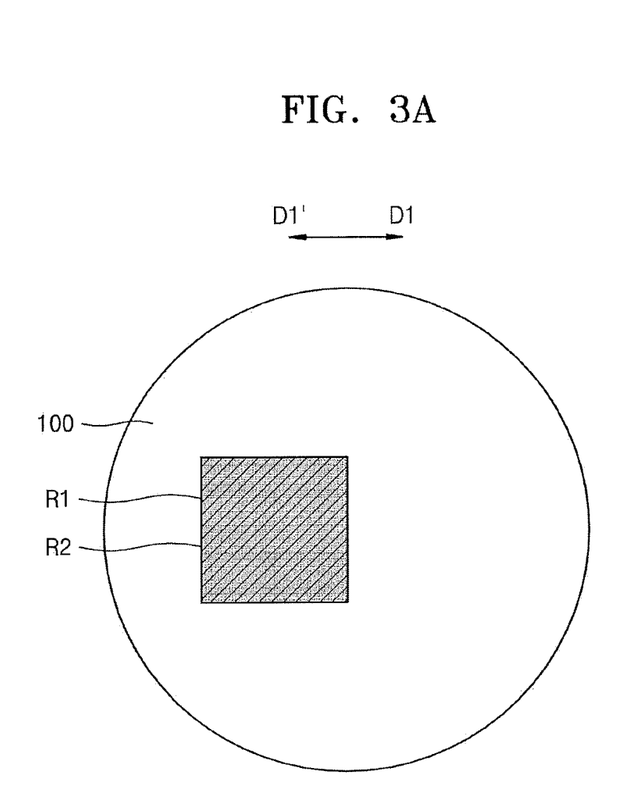
FIGS. 3A-3D illustrate example results of the laser annealing apparatus.

FIGS. 3A to 3D illustrate layout diagrams showing example effects of a laser annealing apparatus according to some embodiments. Referring to FIG. 3A, the first laser beam L1 and the second laser beam L2 may reach the semiconductor substrate 100. A region of the semiconductor substrate 100 to which the first laser beam L1 is irradiated may be referred to as a first region R1. A region of the semiconductor substrate 100 to which the second laser beam L2 is irradiated is referred to as a second region R2. At least some portions of the first region R1 may overlap the second region R2. In one embodiment, the widths of the first region R1 and the second region R2 may be the same. In another embodiment, these widths may be different. In one embodiment, the profiles of the first region R1 and the second region R2 may be identical to each other. In another embodiment, these profiles may be different. In one embodiment, the first region R1 and the second region R2 may be substantially identical to each other. In another embodiment, these regions may be different.

Figure 3B:
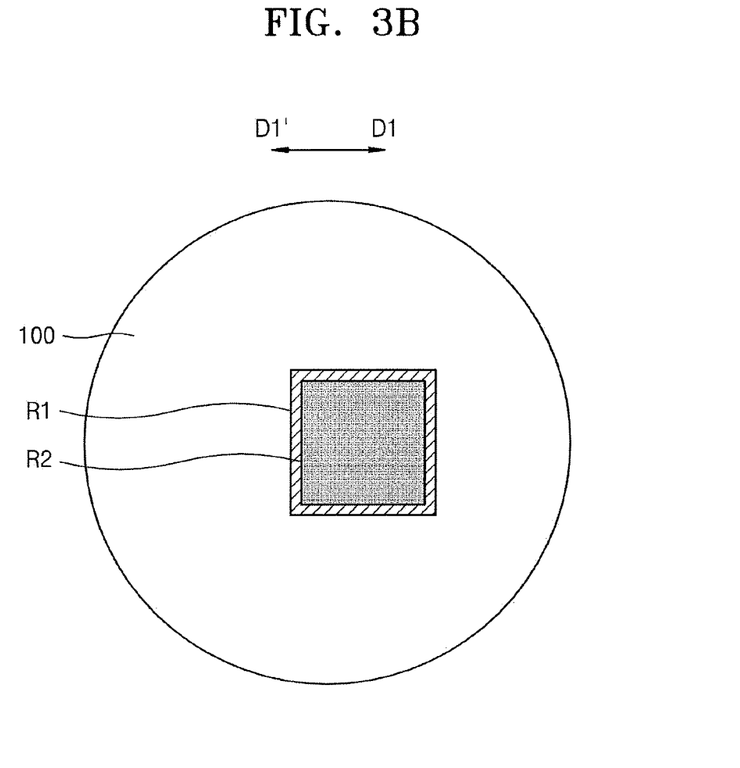

Referring to FIG. 3B, the first region R1 may include at least a portion of the second region R2. According to some embodiments, the first region R1 may include the entire second region R2.

Figure 3C:
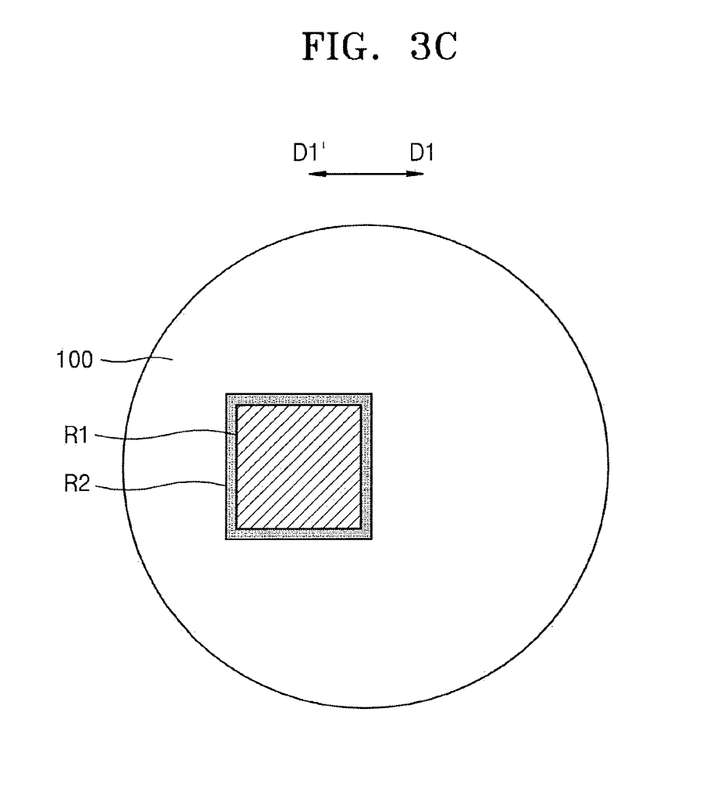

Referring to FIG. 3C, the second region R2 may include at least a portion of the first region R1. According to some embodiments, the second region R2 may include the entire first region R1.

Figure 3D:
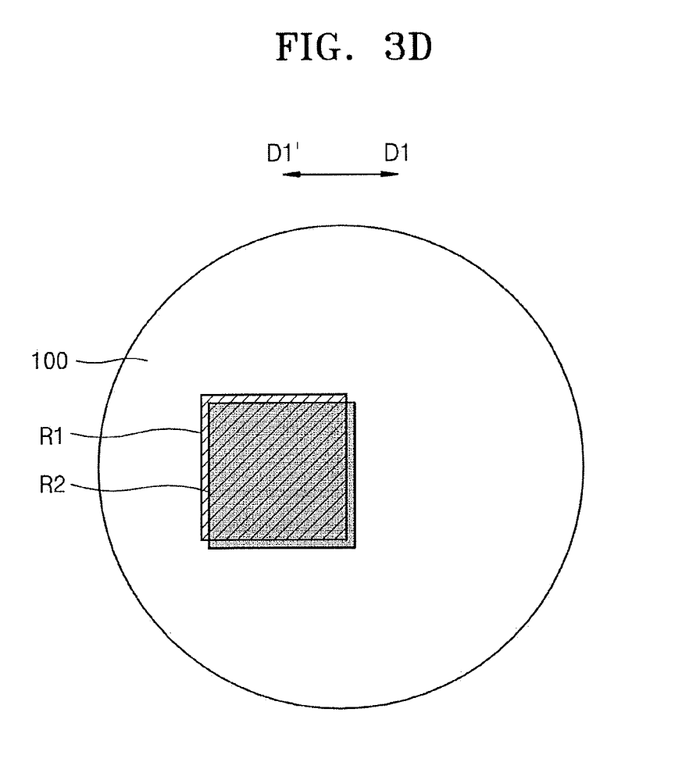

Referring to FIG. 3D, the second region R2 may include a portion of the first region R1 and the first region R1 may include a portion of the second region R2, but a center of the first region R1 and a center of the second region R2 may not overlap each other when the first region R1 and the second region R2 are viewed, for example, from above. Thus, the first region R1 and the second region R2 may be misaligned.

As described above, the laser annealing apparatus 1 (except the chamber 200) may move two-dimensionally on a plane perpendicular to a direction in which the first laser beam L1 is incident to the semiconductor substrate 100. Thus, the first laser beam L1 may be irradiated onto the entire top surface of the loaded semiconductor substrate 100. According to some embodiments, when the laser annealing apparatus 1 (except the chamber 200) is fixed and the chamber 200 moves at a certain moment in a first direction D1, the first region R1 and the second region R2 may move on the semiconductor substrate 100 in a second direction D1' opposite the first direction D1.

According to some embodiments, when the chamber 200 is fixed, the laser annealing apparatus 1 (except the chamber 200) moves. A direction in which the laser annealing apparatus 1 (other than the chamber 200) moves at a certain moment may be referred to as the first direction D1. The first region R1 may move on the semiconductor substrate 100 in the first direction D1.

FIGS. 3A to 3D correspond to FIG. 2A and are related to a case where the MSK 27 is provided to include the rectangular light transmitting region 29. In one embodiment, when the first laser beam has a circular first beam cross-section, a MSK 27a may be provided to include a circular light transmitting region 29a. In this case, a first region and a second region may be circular. For example, when the first laser beam has a pentagonal first beam cross-section, a MSK 27b may be provided to include a pentagonal light transmitting region 29b. In this case, a first region and a second region may have a predetermined shape, e.g., pentagonal. In one embodiment, the first and second regions may be, for example, triangular, hexagonal, or higher polygonal according to some embodiments.

FIGS. 3A to 3D correspond to a case where the first laser beam L1 and the second laser beam L2 are simultaneously irradiated. In one embodiment, when measuring a degree of contamination of the optical window 240 using the second laser beam L2 before laser annealing, the second laser beam L2 may be irradiated to the second region R2 on the semiconductor substrate 100, but the first laser beam L1 may not be irradiated on the semiconductor substrate 100.

Referring to FIG. 1, the second reflection mirror M2 may be on the second optical path. The second reflection mirror M2 may exhibit a predetermined, relatively high reflectivity with respect to the second laser beam L2. In one embodiment, the second reflection mirror M2 may exhibit a predetermined, relatively high reflectivity with respect to the second wavelength. Referring to FIG. 1, the single second reflection mirror M2 is provided. In one embodiment of an optical system, the second reflection mirror M2 may be omitted or two or more second reflection mirrors M2 may be provided.

A first beam splitter BS1 may be on the second optical path and may split the second laser beam L2. The first beam splitter BS1 may transmit a part of the second laser beam L2 and reflect the remaining part of the second laser beam L2.

The first beam splitter BS1 may be a semi-transmissive reflective plate, for example. The first beam splitter BS1 may transmit about 50% of the second laser beam L2 and reflect about 50% of the second laser beam L2. In another embodiment, the beam splitter may transmit and reflect different percentages of the second laser beam L2.

The second laser beam L2 reflected by the first beam splitter BS1 may be incident onto the first power meter PM1. The second laser beam L2 transmitted through the first beam splitter BS1 may be irradiated onto the semiconductor substrate 100 through the optical window 240. The first reflection mirror M1 is on the second optical path toward the semiconductor substrate 100, but the first reflection mirror M1 may transmit the second laser beam L2 therethrough.

A third laser beam L3 may be the second laser beam L2 reflected by the semiconductor substrate 100. Referring to FIG. 1, the first reflection mirror M1 may be on a third optical path, which is an optical path for the third laser beam L3. In one embodiment, the third laser beam L3 may pass through the first reflection mirror M1 like the second laser beam L2.

The first beam splitter BS1 may split the third laser beam L3, and may transmit a part of the third laser beam L3 therethrough and reflect the remaining part of the third laser beam L3. The first beam splitter BS1 may transmit about 50% of the third laser beam L3 and reflect about 50% of the third laser beam L3. In another embodiment, the beam splitter may transmit and reflect different percentages of the third laser beam L3. In one embodiment, the third laser beam L3 reflected by the first beam splitter BS1 may be incident onto the second power meter PM2.

The second band blocking filter 33 may be on the third optical path, but may be apart from the first optical path. The second band blocking filter 33 may be on a part of the third optical path between the first optical splitter BS1 and the second power meter PM2. The second band blocking filter 33 may block light of the first wavelength and may pass light of the second wavelength therethrough. The second band blocking filter 33 may prevent light of the first wavelength from being incident onto the second power meter PM2. Therefore, the reliability of measuring the degree of contamination of the optical window 240 may be improved by blocking the influence of light of the first wavelength on an output of the second power meter PM2.

The first focusing lens 35 may be on the third optical path, but may be apart from the first optical path. The first focusing lens 35 may be on a part of the third optical path between the first beam splitter BS1 and the second power meter PM2. The first focusing lens 35 may focus the third laser beam L3 to the second power meter PM2.

The first power meter PM1 may measure the energy of the second laser beam L2 reflected by the first beam splitter BS1. The first power meter PM1 may include a photodiode, for example. The second power meter PM2 may measure the energy of the third laser beam L3 reflected by the first beam splitter BS1. The second power meter PM2 may include a photodiode, for example.

The degree of contamination of the optical window 240 may be determined by comparing an output of the first power meter PM1 and an output of the second power meter PM2. For example, the degree of contamination of the optical window 240 may be determined based on a ratio between the output of the second power meter PM2 and the output of the first power meter PM1. When a measured ratio between the output of the first power meter PM1 and the output of the second power meter PM2 is less than a predetermined value, the transparency of the optical window 240 may have been deteriorated due to contamination.

The degree of contamination of the optical window 240 may be measured before and/or during an annealing operation. After the degree of contamination of the optical window 240 is measured, when the degree of contamination is greater than a certain reference value, an appropriate measure may be taken to improve the state of the optical window 240. For example, the optical window 240 may be cleaned or replaced.

According to some embodiments, in the case of measuring the degree of contamination of the optical window 240 before annealing, a sampled substrate having properties identical or similar to those of a semiconductor substrate that is actually to be annealed may be on the chuck 230 to reflect the second laser beam L2 incident to the chamber 200. In one embodiment, the semiconductor substrate 100 to be annealed may be on the chuck 230 in case of measuring the degree of contamination of the optical window 240 before an annealing operation.

Figure 4:
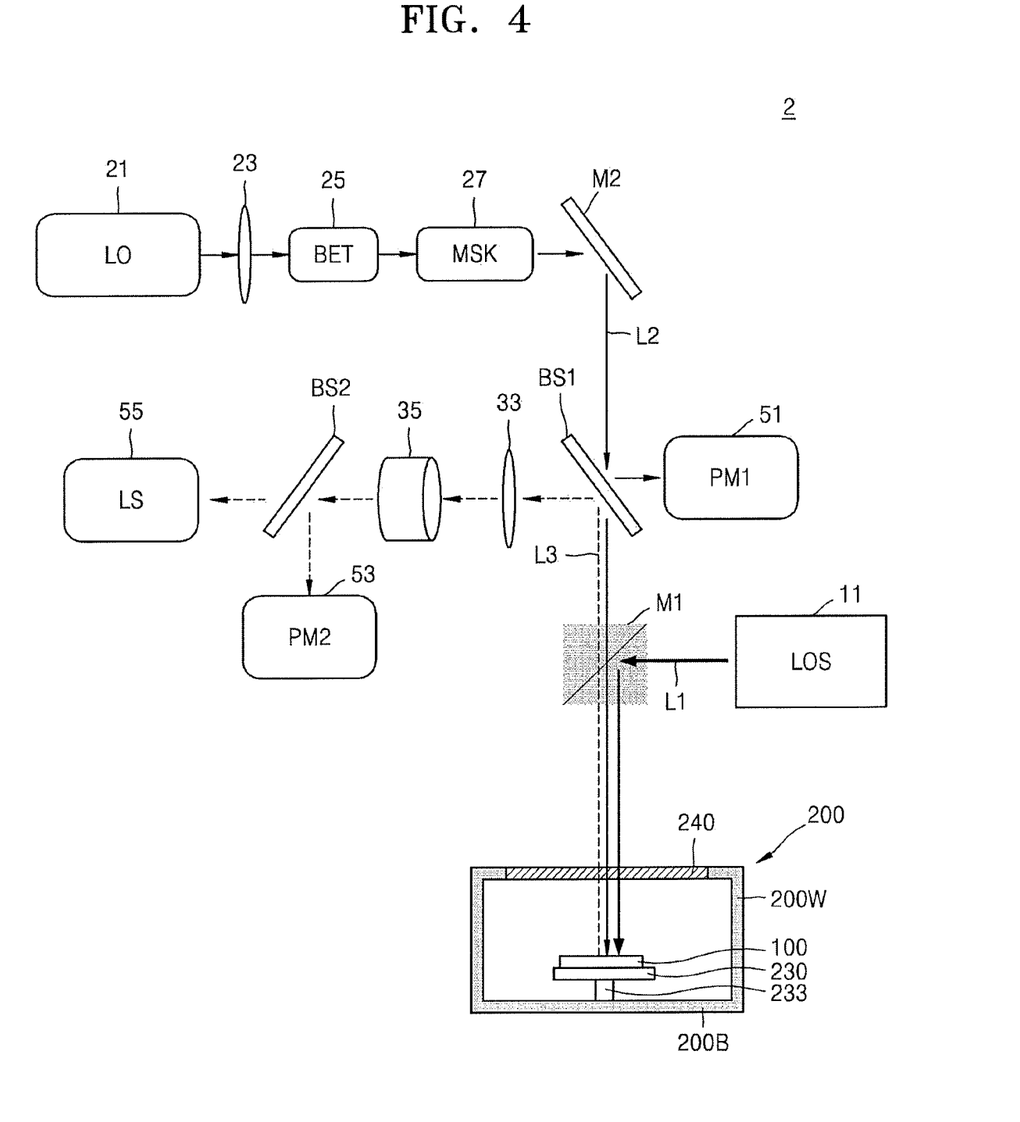
FIG. 4 illustrates another embodiment of a laser annealing apparatus.

FIG. 4 illustrates another embodiment of a laser annealing apparatus 2 which includes the LOS 11, the LO 21, the first and second band blocking filters 23 and 33, the BET 25, the MSK 27, the first focusing lens 35, the first and second power meters 51 and 53, the first and second reflection mirrors M1 and M2, and the chamber 200. Furthermore, the laser annealing apparatus 2 may include a second beam splitter BS2 and an optical sensor 55.

The second beam splitter BS2 may be on the third optical path and may be substantially identical to the first beam splitter BS1. The second beam splitter BS2 may transmit a part of the third laser beam L3 and reflect the remaining part of the third laser beam L3. The second beam splitter BS2 may transmit about 50% of the third laser beam L3 therethrough and reflect about 50% of the third laser beam L3. The second beam splitter BS2 may transmit and reflect different percentages of the third laser beam L3 in another embodiment.

According to some embodiments, as shown in FIG. 4, the third laser beam L3 reflected by the second beam splitter BS2 may be incident to the second power meter PM2, and the third laser beam L3 transmitted through the second beam splitter BS2 may be incident to optical sensor 55. According to some other embodiments, unlike as shown in FIG. 4, the third laser beam L3 reflected by the second beam splitter BS2 may be incident to the optical sensor 55, and the third laser beam L3 transmitted through the second beam splitter BS2 may be incident to the second power meter PM2. In one embodiment, the arrangement of the optical sensor 55 and the second power meter PM2 may be switched.

According to some embodiments, in addition to measuring the degree of contamination of the optical window 240 by comparing the output of the first power meter PM1 to the output of the second power meter PM2, it may be determined via the optical sensor 55 whether the upper portion of the substrate 100 is melted.

The optical sensor 55 may measure an intensity of the third laser beam L3 reflected by the semiconductor substrate 100 at a predetermined time, e.g., in real time. The optical sensor 55 may measure the energy of light in, for example, the visible ray band. A change of reflectivity may be measured based on a change of the intensity of the third laser beam L3 according to the lapse of time measured by the optical sensor 55. Generally, the reflectivity of the semiconductor substrate 100 in a molten state is greater than that of the semiconductor substrate 100 in a solid state. Therefore, the intensity of the third laser beam L3 measured by the optical sensor 55 at a point where the semiconductor substrate 100 is melted may be increased. Thus, a change of the phase of the semiconductor substrate 100 may be determined.

At this time, a measured value of the second power meter PM2 may be changed depending on whether the semiconductor substrate 100 is melted or not. As described above, the phase of the semiconductor substrate 100 may be determined via the optical sensor 55. In case of measuring the degree of contamination of the optical window 240 during a laser annealing, the degree of contamination of the optical window 240 may be precisely measured by correcting a change of measured values of the second power meter PM2 associated with melting of the semiconductor substrate 100.

Figure 6:
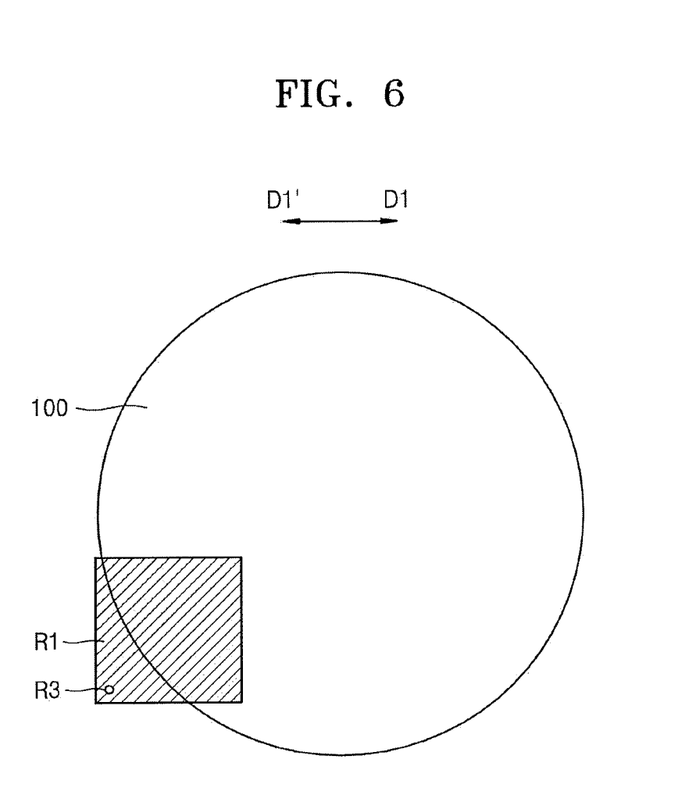
FIG. 6 illustrates other example results of a laser annealing apparatus.

FIG. 6 illustrates another example effect of a laser annealing apparatus. Referring to FIG. 6, in an existing laser annealing apparatus, a laser beam from a point light source may be used to measure the degree of contamination of an optical window. When a laser beam from an existing point light source is employed, a third area R3 may correspond to a region on a plane extending in parallel with the top surface of the semiconductor substrate 100, the region to which a laser beam for measuring the degree of contamination of the optical window reaches. At this time, the third region R3 may be limited to a narrow region. For example, the third region R3 may be significantly smaller than the first region R1 reached by the first laser beam L1 for annealing. In this case, while the first laser beam L1 is being irradiated to an edge of the semiconductor substrate 100, a laser beam for measuring contamination of the optical window and/or determining whether the semiconductor substrate 100 is melted may be irradiated outside the semiconductor substrate 100. Therefore, it may be impossible to determine whether the semiconductor substrate 100 is melted while an edge of the semiconductor substrate 100 is being annealed, and the degree of contamination of the optical window 240 may be incorrectly measured.

On the other hand, when the first region R1 and the second region R2 are substantially identical to each other as shown, for example, in FIG. 3A, at least a portion of the second laser beam L2 may be irradiated onto the semiconductor substrate 100 even when the first laser beam L1 is irradiated to an edge of the semiconductor substrate 100. Therefore, it may be determined whether or not the semiconductor substrate 100 is melted. Also the degree of contamination of the optical window 240 may be precisely measured.

Figure 5:
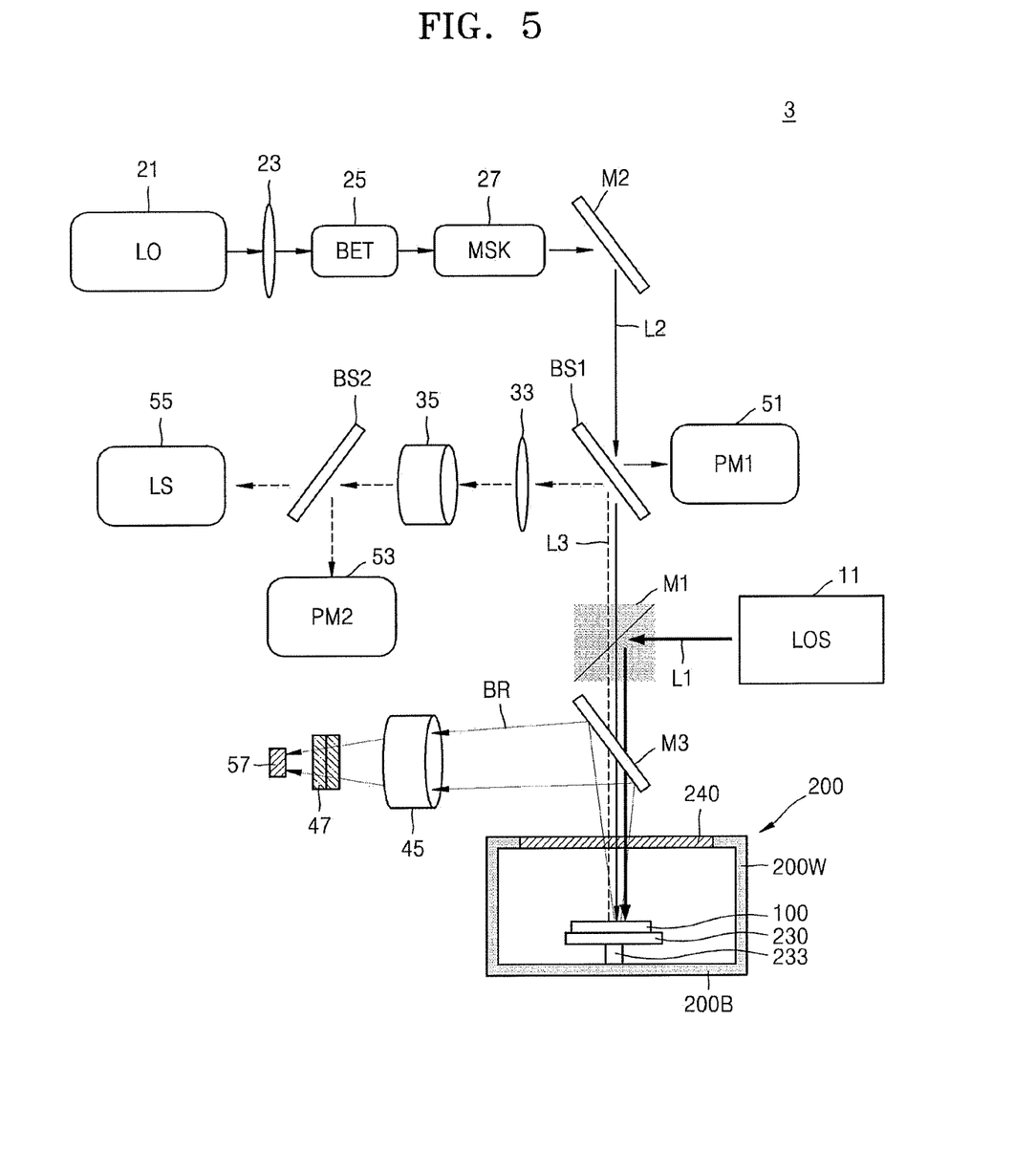
FIG. 5 illustrates another embodiment of a laser annealing apparatus.

FIG. 5 illustrates another embodiment of a laser annealing apparatus 3 which includes an LOS 11, LO 21, first and second band blocking filters 23 and 33, BET 25, MSK 27, first and second power meters 51 and 53, first and second reflection mirrors M1 and M2, chamber 200, second beam splitter BS2, and optical sensor 55. The laser annealing apparatus 3 may further include a second focusing lens 45, a band pass filter 47, and an infrared ray sensor 57.

The semiconductor substrate 100 may emit light in the infrared ray wavelength band through black body radiation before, during, and after laser annealing. Black body radiation light BR may be light radiated through black body radiation of the semiconductor substrate 100.

A third reflection mirror M3 may be on the semiconductor substrate 100 and may reflect light in the infrared ray band. The third reflection mirror M3 may reflect light of a wavelength from, for example, about 2 μm to about 20 μm. The third reflection mirror M3 may reflect light in a different wavelength range in another embodiment.

The third reflection mirror M3 may reflect the black body radiation light BR and may transmit the first through third laser beams L1, L2, and L3 therethrough. The third reflection mirror M3 may be transparent with respect to the first through third laser beams L1, L2, and L3.

The black body radiation light BR reflected by the third reflection mirror M3 may pass through the second focusing lens 45 and the band pass filter 47 and reach the infrared ray sensor 57. The second focusing lens 45 may focus the black body radiation light BR onto the infrared ray sensor 57. The band pass filter 47 may pass light of a specific wavelength band from the black body radiation light BR. The band pass filter 47 may include, for example, a combination of multiple band pass filters. The infrared ray sensor 57 may correspond to a photodiode that operates at a high speed. Therefore, a radiation intensity of the semiconductor substrate 100 for a specific wavelength band may be measured at a predetermined time, e.g., in real time. The radiation intensity detected by the infrared ray sensor 57 may be processed, for example, in real time, based on pre-calibrated data and converted to the temperature of the semiconductor substrate 100.

At this time, the radiation ratios of the semiconductor substrate 100 in a solid state and the semiconductor substrate 100 in a molten state may be different from each other. By measuring the reflectivity of the semiconductor substrate 100 through the optical sensor 55, the temperature of the semiconductor substrate 100 may be precisely measured by calibrating a change of the intensity of radiated light according to a phase change of the semiconductor substrate 100.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A laser annealing apparatus, comprising:
   a laser oscillating structure configured to emit a first laser beam having a first wavelength and a first beam cross-section to a semiconductor substrate inside a chamber that includes an optical window;
   a laser oscillator configured to emit a second laser beam to the semiconductor substrate, the second laser beam having a second wavelength different from the first wavelength;
   a beam expanding telescope on an optical path for the second laser beam, the beam expanding telescope configured to expand a cross-section of the second laser beam to a second beam cross-section;
   a first power meter configured to measure energy of the second laser beam;
   a first beam splitter on the optical path for the second laser beam, the first beam splitter being between the beam expanding telescope and the optical window of the chamber; and
   a second power meter configured to measure energy of a third laser beam, the laser annealing apparatus being configured such that the third laser beam is generated as the second laser beam is reflected by the semiconductor substrate toward the first beam splitter, such that the third laser beam is incident on the first beam splitter, wherein the first laser beam is configured such that an area of the first beam cross-section of the first laser beam that reached the semiconductor substrate is identical to an area of the second beam cross-section, wherein the first laser beam is configured to anneal the semiconductor substrate such that a portion of a top surface of the semiconductor substrate is melted, and wherein the first laser beam and the second laser beam are configured to be simultaneously irradiated on the semiconductor substrate.

2. The laser annealing apparatus as claimed in claim 1, wherein the first wavelength is shorter than the second wavelength.

3. The laser annealing apparatus as claimed in claim 1, wherein the first beam cross-section of the first laser beam that reached the semiconductor substrate and the second beam cross-section corresponds to same portion of the semiconductor substrate.

4. The laser annealing apparatus as claimed in claim 1, further comprising:
   an infrared ray sensor to detect black body radiation light discharged from the semi conductor substrate.

5. The laser annealing apparatus as claimed in claim 1, wherein at least a portion of a first optical path of the first laser beam overlaps at least a portion of a second optical path of the second laser beam.

6. The laser annealing apparatus as claimed in claim 5, further comprising:
   a first band blocking filter on a portion of the second optical path between the beam expanding telescope and the laser oscillator, wherein the first band blocking filter is to block light of the first wavelength.

7. The laser annealing apparatus as claimed in claim 5, wherein the first beam splitter is configured to split the second laser beam that passed through the beam expanding telescope along the second optical path, wherein the first power meter is to measure energy of one of two beams that occur after splitting of the second laser beam by the first beam splitter.

8. The laser annealing apparatus as claimed in claim 5, further comprising:
   a beam mask on the second optical path,
   wherein the beam mask includes a light screening region and a light transmitting region defined by the light screening region.

9. The laser annealing apparatus as claimed in claim 8, wherein:
   the light transmitting region is surrounded by the light screening region, and
   a shape of the light transmitting region is identical to a shape of the first beam cross-section.

10. The laser annealing apparatus as claimed in claim 5, further comprising:
    a second band blocking filter on a third optical path of the third laser beam, wherein the second band blocking filter is to screen light of the first wavelength.

11. The laser annealing apparatus as claimed in claim 10, further comprising:
    an optical sensor, on the third optical path, to measure reflectivity of the semiconductor substrate.

* * * * *